(12) United States Patent
Bolton et al.

(10) Patent No.: US 11,053,020 B2
(45) Date of Patent: Jul. 6, 2021

(54) ELECTRICALLY CONDUCTIVE PATCH FOR INDICATING A COMPROMISED ELECTRICAL DISCHARGE POINT IN AN AIRCRAFT

(71) Applicant: The Boeing Company, Chicago, IL (US)

(72) Inventors: Joseph A. Bolton, Newalla, OK (US); Keith D. Humfeld, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 147 days.

(21) Appl. No.: 16/539,486

(22) Filed: Aug. 13, 2019

(65) Prior Publication Data
US 2021/0047049 A1 Feb. 18, 2021

(51) Int. Cl.
| | | |
|---|---|---|
| H05K 9/00 | (2006.01) | |
| B64D 45/02 | (2006.01) | |
| B60C 19/08 | (2006.01) | |
| B64C 1/12 | (2006.01) | |
| H05F 3/00 | (2006.01) | |
| H02G 13/00 | (2006.01) | |

(52) U.S. Cl.
CPC .......... *B64D 45/02* (2013.01); *H05K 9/0079* (2013.01); *B60C 19/08* (2013.01); *B64C 1/12* (2013.01); *H02G 13/80* (2013.01); *H05F 3/00* (2013.01); *H05K 9/00* (2013.01)

(58) Field of Classification Search
USPC .......................................... 361/212, 218, 220
See application file for complete search history.

(56) References Cited

U.S. PATENT DOCUMENTS

| | | | | |
|---|---|---|---|---|
| 8,947,847 | B2 * | 2/2015 | Langone | ............... B29C 70/386 |
| | | | | 361/218 |
| 2010/0263898 | A1 * | 10/2010 | Hebert | ...................... B64C 1/12 |
| | | | | 174/2 |
| 2010/0264665 | A1 * | 10/2010 | Hebert | ................... H02G 13/80 |
| | | | | 290/55 |
| 2017/0132901 | A1 | 5/2017 | Choi | |

* cited by examiner

*Primary Examiner* — Danny Nguyen

(57) ABSTRACT

An electrically conductive patch for a sheet that is part of a skin of an aircraft is disclosed. The sheet includes an outermost surface constructed of an electrically conductive material and one or more electrical discharge points that are conductively coupled to the outermost surface of the sheet. The electrically conductive patch is disposed along the outermost surface of the sheet and is conductively coupled to the outermost surface of the sheet. The electrically conductive patch is constructed of a voltage responsive film configured to change from a first coloration and into a second coloration in response to experiencing a threshold voltage difference, where the first coloration substantially matches a coloration of the skin of the aircraft.

20 Claims, 4 Drawing Sheets

ELECTRICALLY CONDUCTIVE PATCH FOR INDICATING A COMPROMISED ELECTRICAL DISCHARGE POINT IN AN AIRCRAFT

INTRODUCTION

The present disclosure relates to electrical discharge points for an aircraft. More particularly, the present disclosure relates to an electrically conductive patch conductively coupled to the skin of the aircraft, where the electrically conductive patch changes coloration to indicate a compromised electrical discharge point.

BACKGROUND

Static electricity builds up along the skin of an aircraft during flight. Specifically, electrons from the air's molecules are stripped and accumulate along the skin of the aircraft during flight. Accordingly, static electricity dischargers are bonded to the aircraft skin and discharge the static electricity that builds up along the skin of the aircraft. For example, static wicks are often attached to the outboard trailing edges and the horizontal and vertical stabilizers of the aircraft wings. The static wicks dissipate the static electricity that accumulates along the aircraft skin during flight into the atmosphere. Static bonding straps are also located strategically along the exterior of the aircraft. The bonding straps electrically connect a conducting component to a grounded main frame of the aircraft. In another example, the skin of a military aircraft includes nuclear hardened surfaces. The nuclear hardened surfaces act as the static electricity dischargers.

The static electricity dischargers are constantly exposed to the environment, and therefore the static electricity dischargers may experience issues such as, but not limited to, corrosion. As a result, the static wicks and bonding straps may lose their effectiveness over time. Accordingly, during maintenance of the aircraft, each bonding strap and static wick needs to be inspected for current path efficacy. However, since an aircraft includes numerous static wicks and bonding straps, inspection may become very time consuming and costly.

SUMMARY

According to several aspects, A sheet that is part of a skin of an aircraft is disclosed. The sheet includes an outermost surface constructed of an electrically conductive material, one or more electrical discharge points that are conductively coupled to the outermost surface of the sheet, and an electrically conductive patch disposed along the outermost surface of the sheet and conductively coupled to the outermost surface of the sheet. The electrically conductive patch is constructed of a voltage responsive film configured to change from a first coloration and into a second coloration in response to experiencing a threshold voltage difference. The first coloration substantially matches a coloration of the skin of the aircraft.

In another aspect, an aircraft having a skin is disclosed. The aircraft includes a sheet that is part of the skin of an aircraft, where the sheet defines an outermost surface that is constructed of an electrically conductive material. The aircraft also includes one or more electrical discharge points that are conductively coupled to the outermost surface of the sheet, and an electrically conductive patch disposed along the outermost surface of the sheet and conductively coupled to the outermost surface of the sheet. The electrically conductive patch is constructed of a voltage responsive film configured to change from a first coloration and into a second coloration in response to experiencing a threshold voltage difference. The first coloration substantially matches a coloration of the skin of the aircraft.

In still another aspect, a method for detecting a compromised electrical discharge point along a skin of an aircraft is disclosed. The method includes creating a static charge buildup across an outermost surface of a sheet that is part of the skin of the aircraft. The static charge buildup is created by a static charge that collects along a static dissipation discharge path along the outermost surface of the sheet. The method also includes creating a threshold voltage difference along the static dissipation discharge path by the static charge buildup. The method includes changing an electrically conductive patch disposed along the outermost surface of the sheet from a first coloration to a second coloration in response to experiencing the threshold voltage difference. The electrically conductive patch is constructed of a voltage responsive film, and the first coloration is configured to substantially match a coloration of the skin of the aircraft.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The present disclosure relates to an electrically conductive patch conductively coupled to a sheet that is part of the skin of an aircraft. The electrically conductive patch changes coloration to indicate a compromised electrical discharge point. Specifically, the electrically conductive patch is constructed of a voltage responsive film, where the voltage responsive film is configured to change from a first coloration and into a second coloration in response to experiencing a threshold voltage difference. The threshold voltage difference is created by a static charge buildup located along a static dissipation discharge path of the sheet when the electrical discharge point is compromised.

The first coloration of the voltage responsive film substantially matches the coloration of the skin of the aircraft. However, the second coloration contrasts the first coloration. For example, in one non-limiting approach, the second coloration is a complimentary color when compared to the first coloration. When the electrical discharge point is not compromised, the first coloration substantially matches the coloration of the skin of the aircraft. However, when the electrical discharge points are compromised, the electrically conductive patch changes from the first coloration and into the second coloration. Since the second coloration contrasts with the coloration of the skin of the aircraft, an observer is able to easy see that the electrical discharge point is compromised.

The following description is merely exemplary in nature and is not intended to limit the present disclosure, application, or uses.

Figure 1:
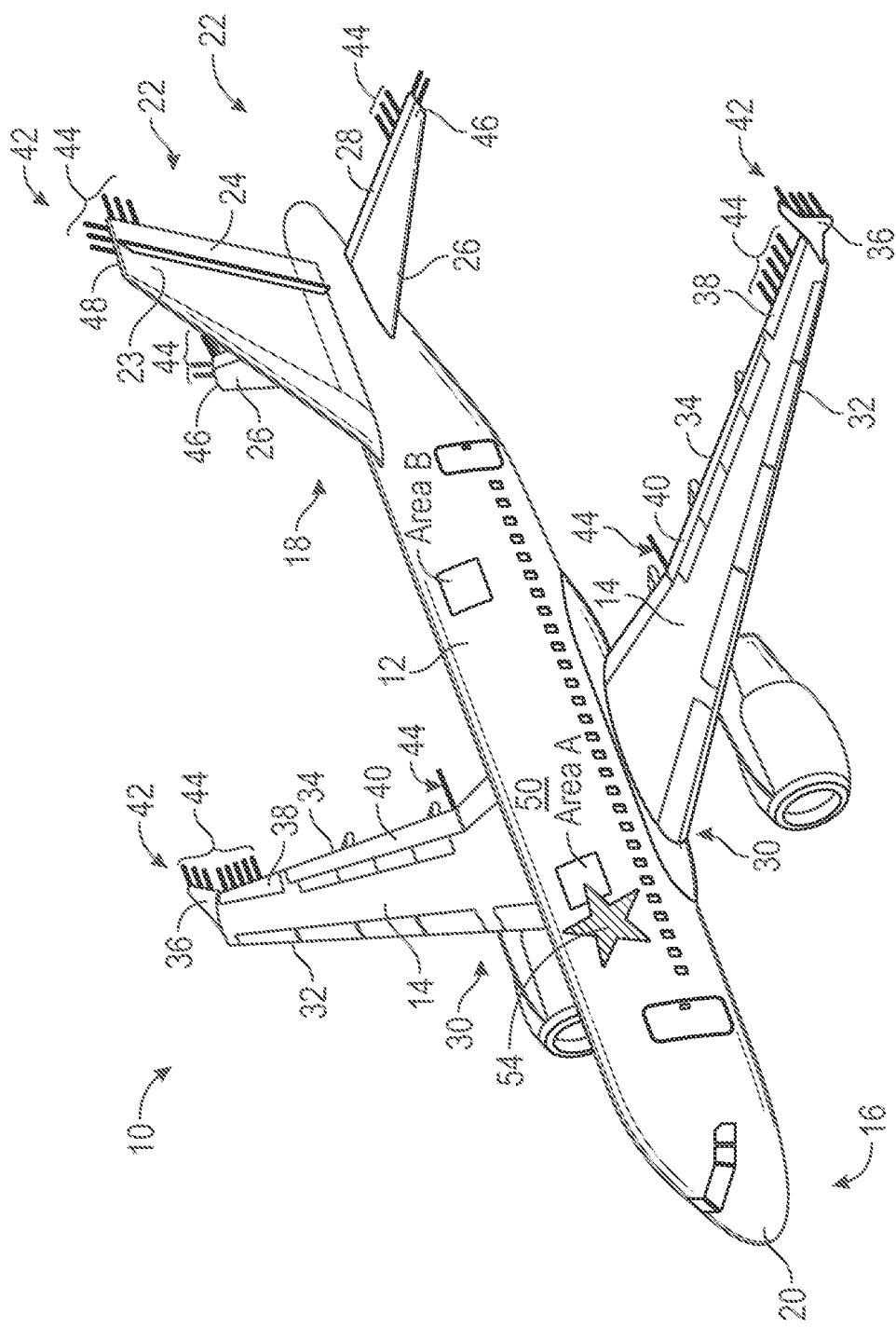
FIG. 1 is a perspective view of an aircraft including a plurality of electrical discharge points, where the electrical discharge points are static wicks, according to an exemplary embodiment.

Referring to FIG. 1, a perspective view of an exemplary aircraft 10 is shown. The aircraft 10 includes a fuselage 12 and a pair of wings 14. A nose 20 is located at a forward end 16 of the aircraft 10 and an empennage 22 is located at an aft end 18 of the aircraft 10. The empennage 22 of the aircraft 10 includes a vertical stabilizer 23 and rudder 24 for yaw control as well as a horizontal stabilizer 26 and elevator 28 for pitch control. The wings 14 of the aircraft 10 extend outwardly from opposing sides 30 of the fuselage 12. Each wing 14 of the aircraft 10 defines a leading edge 32, a trailing edge 34, and a wing tip 36. An aileron 38 and a plurality of flap track fairings 40 are disposed along the trailing edge 34 of each wing 14. A plurality of electrical discharge points 42, which as illustrated in FIG. 1 as static wicks 44, are conductively coupled to a skin 50 of the aircraft 10. Specifically, in the embodiment as shown, the static wicks 44 are disposed along the wing tip 36, aileron 38, and the flap track fairings 40 of each wing 14. The static wicks 44 are also disposed along a tip 46 of the horizontal stabilizer 26 and the elevator 28, as well as along a tip 48 of the vertical stabilizer 23 and the rudder 24.

It is to be appreciated that FIG. 1 is merely exemplary in nature, and the static wicks 44 may be placed along other extremities of the aircraft 10. For example, the static wicks 44 may also be placed along one or more antennas (not shown) of the aircraft 10 as well. As explained below, the static wicks 44 are configured to dissipate static electricity that builds up along the skin 50 of the aircraft 10 and into the atmosphere or the environment. Although FIG. 1 illustrates the static wicks 44, it is to be appreciated that the aircraft 10 includes other types of the electrical discharge points 42 as well. For example, referring to FIG. 3, in another embodiment the electrical discharge point 42 is a bonding strap 52. Finally, although FIG. 1 illustrates a passenger aircraft, it is to be appreciated that FIG. 1 is merely exemplary in nature, and other types of aircraft may be used as well. For example, in another embodiment the aircraft 10 is a military jet.

Figure 2:
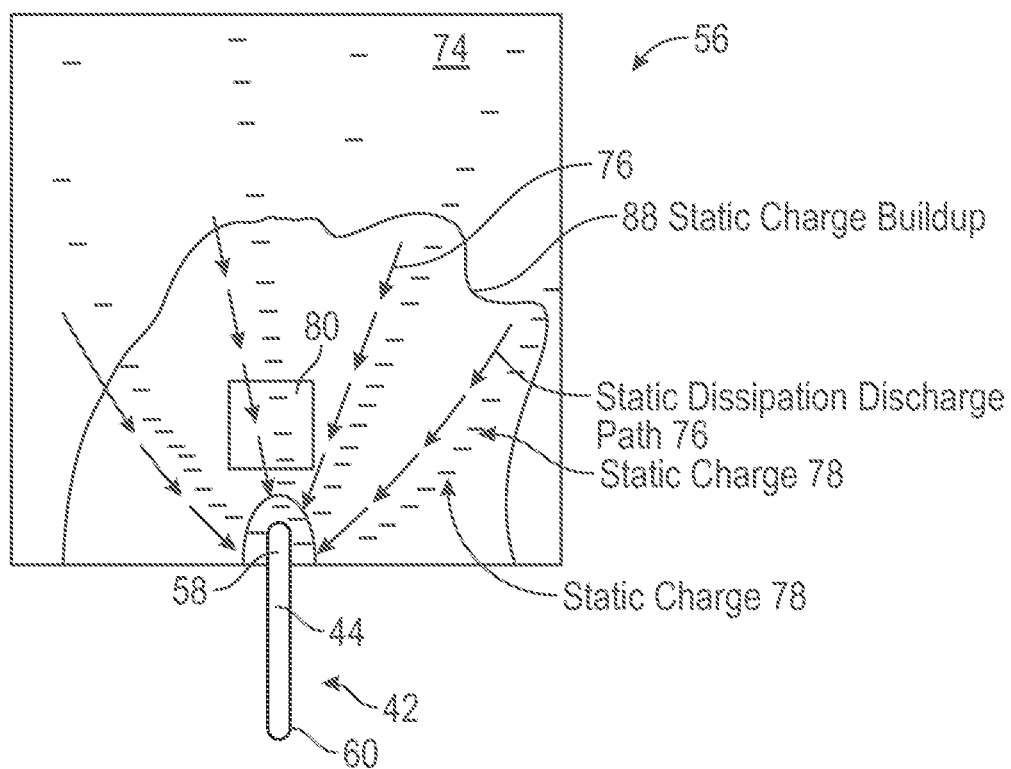
FIG. 2 illustrates a static wick bonded to a sheet of the aircraft, where an electrically conductive patch is disposed along an outermost surface of the sheet, according to an exemplary embodiment.
Figure 3:
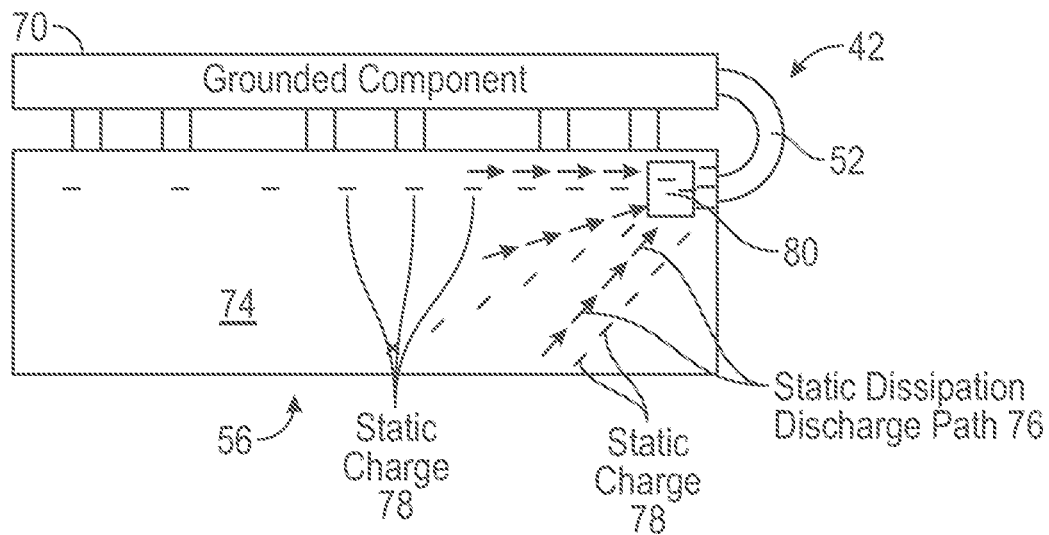
FIG. 3 illustrates a bonding strap as the electrical discharge point for the sheet of the aircraft, where the electrically conductive patch is also disposed along the outermost surface of the sheet, according to an exemplary embodiment.

FIG. 2 is an enlarged view of one or more static wicks 44 electrically coupled to an outermost surface 74 of a sheet 56. The sheet 56 is part of the skin 50 of the aircraft 10 (FIG. 1) and defines the outermost surface 74. The outermost surface 74 of the sheet 56 is constructed of an electrically conductive material such as, for example, aluminum alloys. The static wick 44 includes a first end 58 and a second end 60, where the first end 58 of the static wick 44 is conductively coupled to the outermost surface 74 of the sheet 56, and the second end 60 of the static wick 44 is a free end that discharges static electricity into the environment. Referring now to FIG. 3, in an alternative example the electrical discharge point 42 is a bonding strap 52 conductively coupled to the outermost surface 74 of the sheet 56. The bonding strap 52 conductively couples the outermost surface 74 of the sheet 56 to a grounded component 70 of the aircraft 10. For example, in one embodiment the grounded component 70 of the aircraft 10 is a metal main frame of the aircraft 10.

Since the sheet 56 is part of the skin 50 of the aircraft 10, it is to be appreciated the outermost surface 74 of the sheet 56 is visible. In other words, when an individual observes the aircraft 10, he or she is able to see the sheet 56 (depending on the orientation of the individual). Referring to both FIGS. 1 and 2, the skin 50 of the aircraft 10 includes a coloration. For example, the skin 50 of the aircraft 10 in FIG. 1 includes two colors (i.e., the white color of the background and the color of a star 54). The outermost surface 74 of the sheet 56 substantially matches the coloration of the skin 50 of the aircraft 10. For example, if the skin 50 of the aircraft 10 was completely white, then the outermost surface 74 of the sheet 56 would be white. If the skin 50 of the aircraft 10 is painted different colors, then the sheet 56 may also be painted different colors, depending upon the specific location of the sheet 56 in relation to the fuselage 12 of the aircraft 10. For example, as seen in FIG. 1, if the sheet 56 was located at area A, which represents a portion of the star 54, then the outermost surface 74 of the sheet 56 would include two colors. Specifically, the sheet 56 would be painted both white and the color of the star 54. However, if the sheet 56 was located at area B, then the outermost surface 74 of the sheet 56 would only include a single color.

The one or more electrical discharge points 42 (i.e., the static wick 44 shown in FIG. 2 or the bonding strap 52 in FIG. 3) are configured to create a static dissipation discharge path 76 along the outermost surface 74 of the sheet 56. A static charge 78 travels along the static dissipation discharge path 76 along the outermost surface 74 of the sheet 56. The static dissipation discharge path 76 represents a path that the static charge 78 travels along towards the electrical discharge point 42. The static charge 78 travels along the outermost surface 74 of the sheet 56, towards the electrical discharge point 42, and is then discharged by the electrical discharge point 42.

When the electrical discharge points 42 are not compromised, then a static charge buildup 88 (seen in FIG. 2) is not present along the outermost surface 74 of the sheet 56. The static charge buildup 88 represents an area of concentrated static charge 78. For example, referring to FIG. 3, the bonding strap 52 is not compromised. Accordingly, no static charge buildup 88 is present along the outermost surface 74 of the sheet 56. When compromised, the electrical discharge points 42 are unable to discharge static electricity to the atmosphere (for the static wicks 44) or to the grounded component 70 (for the bonding strap 52). For example, an electrical discharge point 42 may be compromised due to corrosion that occurs when the electrical discharge point 42 is exposed to outside elements such as rain, snow, and other precipitation. As seen in FIG. 2, because the electrical discharge point 42 is compromised, the static charge 78 disposed upon the outermost surface 74 of the sheet 56 is unable to discharge into the atmosphere. As a result, the static charge 78 is concentrated along the static dissipation discharge path 76 to create the static charge buildup 88. As seen in FIG. 2, the static charge 78 is densely collected around the first end 58 of the static wick 44.

Figure 4:
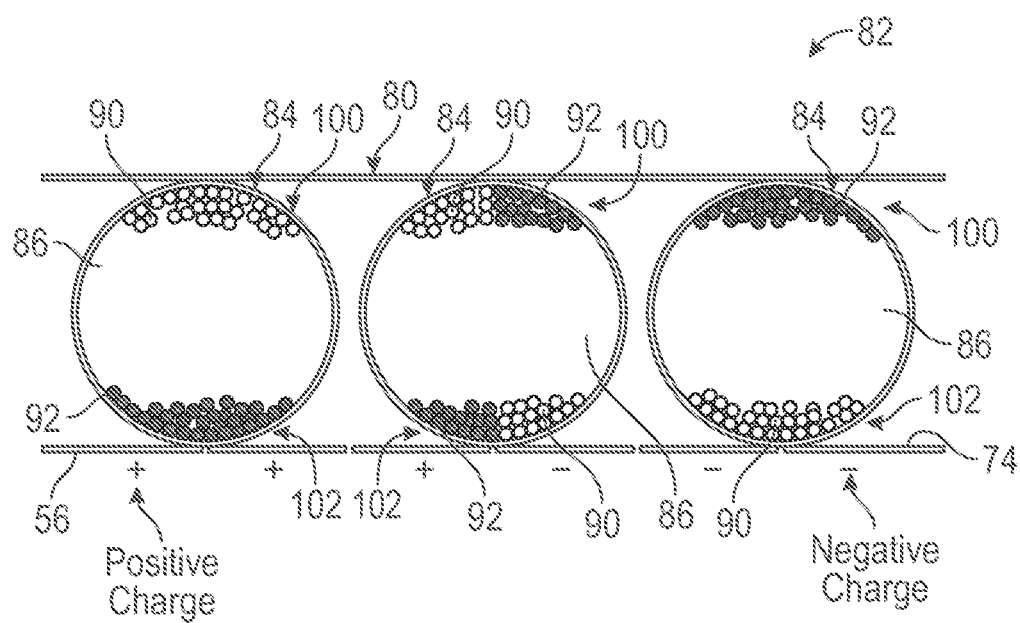
FIG. 4 is a magnified view of a voltage responsive film for the electrically conductive patch, where the voltage responsive film includes a plurality of microcapsules, according to an exemplary embodiment.

Referring to FIGS. 2 and 3, an electrically conductive patch 80 is disposed along the outermost surface 74 of the sheet 56 and is conductively coupled to the outermost surface 74 of the sheet 56. Specifically, the electrically conductive patch 80 is disposed within the static dissipation discharge path 76 of the outermost surface 74 of the sheet 56. The electrically conductive patch 80 is constructed of a voltage responsive film 82 that is shown in FIG. 4, which is described in greater detail below. The electrically conductive patch 80 is configured to change from a first coloration and into a second coloration in response to experiencing a threshold voltage difference. The threshold voltage difference is created in response to the static charge buildup 88 located along the static dissipation discharge path 76 of the outermost surface 74 of the sheet 56. In an embodiment, the threshold voltage difference is either about 20 volts or, alternatively, about 200 volts, however, it is to be appreciated that this embodiment is merely exemplary in nature.

Referring to FIGS. 1-3, the first coloration of the electrically conductive patch 80 substantially matches the coloration of the skin 50 of the aircraft 10. In an embodiment, the sheet 56 includes a plurality of colors. The first coloration of the electrically conductive patch 80 matches the plurality of colors of the sheet 56, which is part of the skin 50 of the aircraft 10, to create a contiguous appearance between the sheet 56 and the electrically conductive patch 80. For example, if a pattern was disposed along the skin 50 of the aircraft 10, then the electrically conductive patch 80 would also match the pattern disposed along the sheet 56, thereby creating an uninterrupted or contiguous appearance along the skin 50 of the aircraft 10. Some examples of patterns that are disposed along the skin 50 of the aircraft 10 include, but are not limited to, text, images, and logos.

In the example as seen in FIG. 1, if the sheet 56 was located at area A, then the sheet 56 would be painted white and the color of the star 54. Accordingly, the first coloration of the electrically conductive patch 80 would be white, the color of the star 54, or a combination of both white and the color of the star 54. The first coloration is determined by the placement of the electrically conductive patch 80 relative to the pattern disposed along the skin 50 of the aircraft 10. Thus, when an observer views the skin 50 of the aircraft 10 (FIG. 1), he or she is unable to detect the electrically conductive patches 80 disposed along the skin 50. In other words, the first coloration of the electrically conductive patch 80 blends in with the skin 50 of the aircraft 10.

The second coloration of the electrically conductive patch 80 contrasts with the first coloration. In one non-limiting embodiment, the second coloration is a complimentary color to the first coloration. Complimentary colors are also referred to as different colors. One example of two complimentary colors include red and green. The second coloration sufficiently contrasts the first coloration so that an observer viewing the aircraft 10 in FIG. 1 is able to easy see when the electrically conductive patch 80 changes coloration. In other words, the second coloration sufficiently contrasts the coloration of the skin 50 of the aircraft 10 such that the differences between the first coloration and the second coloration are detected an observer. If the first coloration includes a plurality of colors, then the second coloration also includes a plurality of colors that contrast with the first coloration. In other words, the second coloration coincides with the pattern disposed along the skin 50 of the aircraft 10. For example, if the sheet 56 was located at area A in FIG. 1, and if the first coloration was both red to represent the color of the star 54 and white to represent the remaining color of the skin 50, then the second coloration would include a color that contrasts the red color of the star 54 as well as a color that would contrast the white color of the background of the skin 50.

If the outermost surface 74 of the sheet 56 is painted, then a portion of the paint is removed to expose the outermost surface 72 before the electrically conductive patch 80 is applied to ensure a conductive bond. In the embodiment as shown in FIGS. 2 and 3, the electrically conductive patch 80 is shaped as a rectangle, however, it is to be appreciated that FIGS. 2 and 3 are merely exemplary in nature and the electrically conductive patch 80 includes any type of shape or configuration. For example, in another embodiment, the electrically conductive patch 80 is shaped as a symbol, one or more letters, or one or more numerals.

Referring to FIG. 4, the voltage responsive film 82 is disposed along the outermost surface 74 of the sheet 56. The voltage responsive film 82 is composed of a plurality of microcapsules 84 that each contain a clear fluid 86. Particles of the first coloration 90 and particles of the second coloration 92 are suspended in the clear fluid 86 within the microcapsule 84, where the particles of the first coloration 90 are positively charged and the particles of the second coloration 92 are negatively charged. The particles of the first coloration 90 substantially match the coloration of the skin 50 of the aircraft 10 (FIG. 1), and the particles of the second coloration 92 contrast with the coloration of the skin 50 of the aircraft 10. In the exemplary embodiment as shown, the particles of the first coloration 90 are white and the particles of the second coloration 92 are black. However, it is to be appreciated that any number of colors may be used as long as the difference in pigment between the particles of the first coloration 90 and the particles of the second coloration 92 is noticeable to an observer.

As seen in FIG. 4, before a negative electric charge is applied the outermost surface 74 of the sheet 56, the sheet 56 is positively charged. Thus, particles of the first coloration 90 are repelled away from the outermost surface 74 of the sheet 56 and rise to an upper portion 100 of the microcapsule 84, while the particles of the second coloration 92 are attracted to the outermost surface 74 of the sheet 56 and are disposed along a lower portion 102 of the microcapsule 84. Thus, because the particles of the first coloration 90 substantially match the coloration of the outermost surface 72 of the sheet 56, the electrically conductive patch 80 blends with the skin 50 of the aircraft 10. However, in response to experiencing a negative charge across the outermost surface 74 of the sheet 56, the particles of the second coloration 92 are repelled away from the outermost surface 74 of the sheet 56 and rise to the upper portion 100 of the microcapsules 84. Thus, an observer would now be able to see a black electrically conductive patch 80 along a white skin 50 of the aircraft 10.

Figure 5:
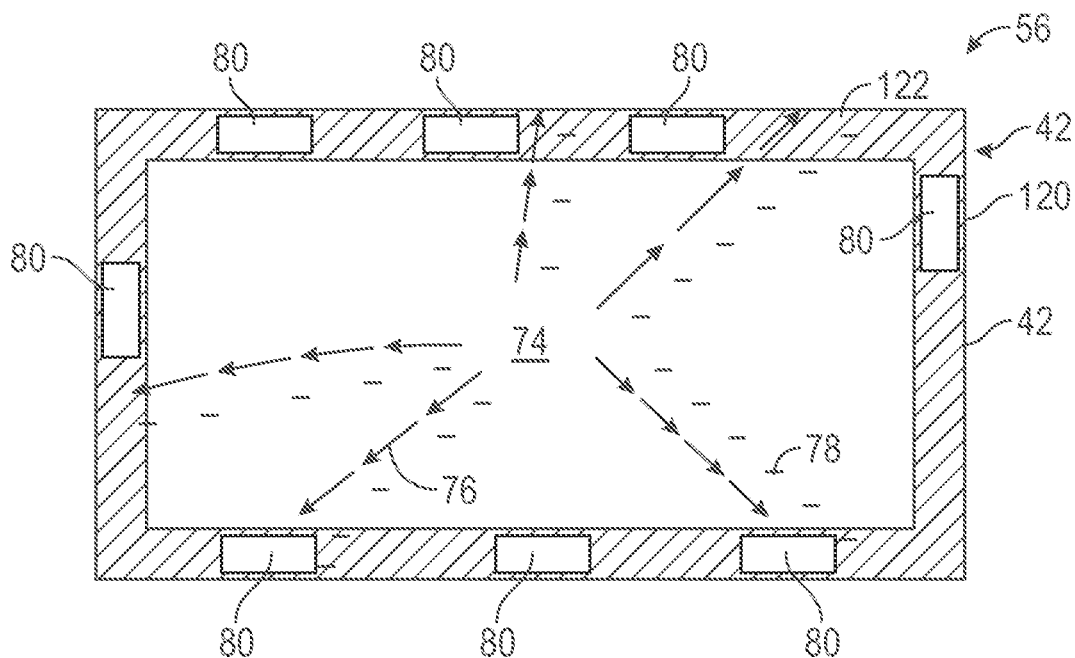
FIG. 5 illustrates the sheet having a nuclear hardened surface, where a plurality of electrically conductive patches are disposed around a portion of the nuclear hardened surface, according to an exemplary embodiment.

FIG. 5 is another embodiment of the sheet 56. As seen in FIG. 5, the sheet 56 defines an outermost perimeter 120. The outermost surface 74 of the sheet 56 includes a nuclear hardened portion 122 around the outermost perimeter 120. In the embodiment as shown in FIG. 5, the nuclear hardened portion 122 of the sheet 56 is illustrated using hatch marks. In one example, the nuclear hardened portion 122 is a composite material that is physically bonded to the sheet 56. Some techniques that may be used to nuclear harden the outermost perimeter 120 of the sheet 56 include, but are not limited to, flame spray, conductive gaskets, conductive epoxies, and conductive greases.

The electrical discharge point 42 is the nuclear hardened portion 122 of the sheet 56, which is disposed around the outermost perimeter 120 of the sheet 56. As seen in FIG. 5, the static dissipation discharge path 76 disposed upon the outermost surface 74 of the sheet 56 is oriented radially outward and towards the outermost perimeter 120 of the sheet 56. Accordingly, the static charge 78 disposed upon the outermost surface 74 of the sheet 56 travels radially outward towards the outermost perimeter 120 of the sheet 56 and is discharged by the nuclear hardened portion 122 of the sheet 56. The electrically conductive patch is disposed around at least a portion of the nuclear hardened portion of the sheet. For example, FIG. 5 illustrates a plurality of electrically conductive patches 80 disposed along only a portion of the nuclear hardened portion 122 of the sheet 56. However, in another embodiment the plurality of electrically conductive patches 80 are disposed along the entire nuclear hardened portion 122 of the sheet 56.

Figure 6:
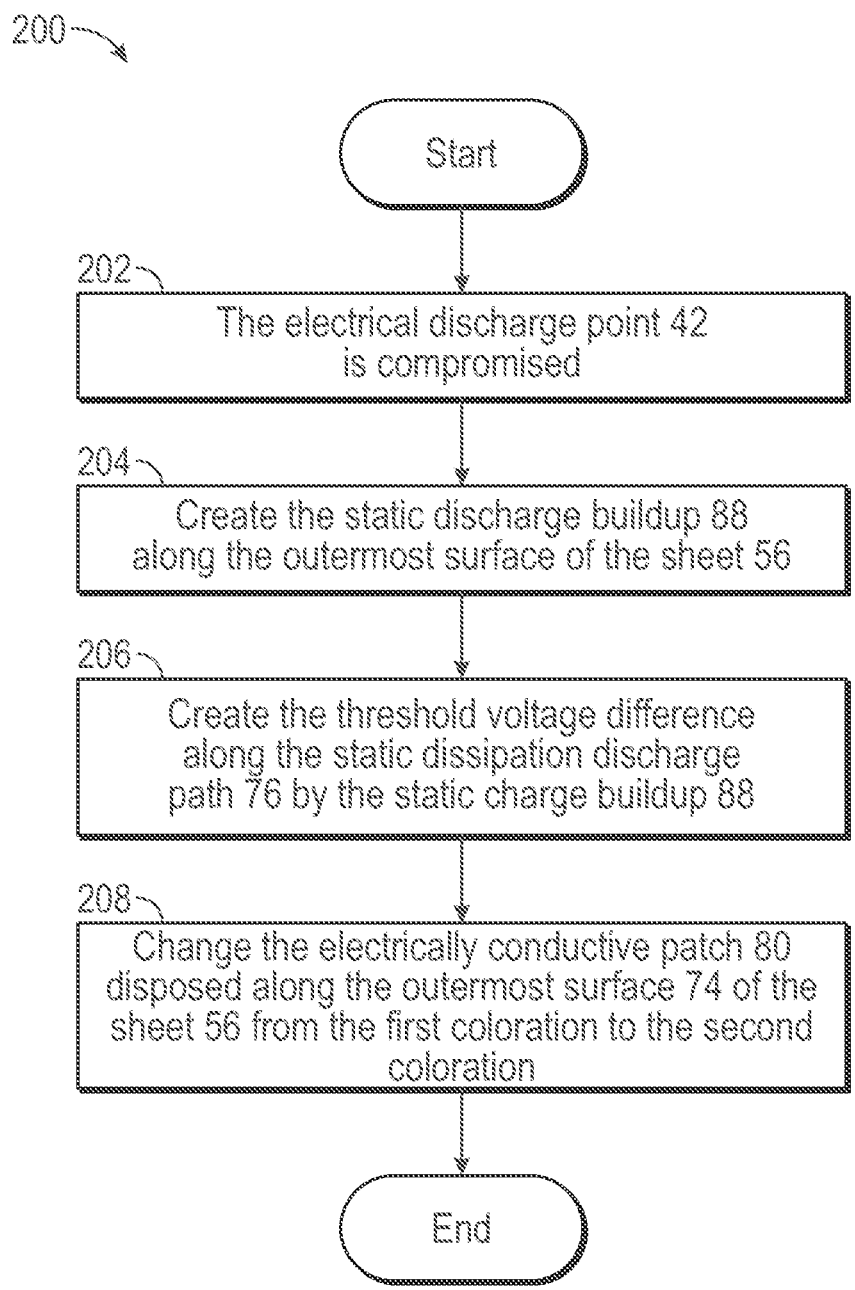
FIG. 6 is a process flow diagram illustrating a method of detecting a compromised electrical discharge point by the electrically conductive patch, according to an exemplary embodiment.

FIG. 6 is a process flow diagram illustrating an exemplary method 200 for indicating a compromised electrical discharge point 42. Referring to FIGS. 1, 2, and 6, the method 200 may begin at block 202. In block 202, the electrical discharge point 42 is compromised. The method 200 may then proceed to block 204.

In block 204, the static charge buildup 88 is created across the outermost surface 74 of the sheet 56, where the sheet 56 is part of the skin 50 of the aircraft 10. As mentioned above, the static charge buildup 88 (FIG. 2) is created by the static charge 78 that collects along the static dissipation discharge path 76 along the outermost surface 74 of the sheet 56 when the electrical discharge point 42 is compromised. The method 200 may then proceed to block 206.

In block 206, the threshold voltage difference is created along the static dissipation discharge path 76 by the static charge buildup 88 (seen in FIG. 2). The method 200 may then proceed to block 208.

In block 208, the electrically conductive patch 80 disposed along the outermost surface 74 of the sheet 56 changes from the first coloration to the second coloration in response to experiencing the threshold voltage difference. As mentioned above, the electrically conductive patch 80 is constructed of the voltage responsive film 82 (FIG. 4), and the first coloration is configured to substantially match the coloration of the skin 50 of the aircraft 10. Accordingly, now an individual who is viewing the aircraft 10 may easily see that the electrically conductive patch 80 has changed to the second coloration. The method 200 may then terminate.

The disclosure offers various technical effects and benefits. Specifically, the disclosed electrically conductive patch provides a visual check to indicate when an electrical discharge point along the skin of the aircraft is compromised. Thus, the present disclosure describes a relatively simply approach for an observer to readily see when an electrical discharge point is compromised. In contrast, the conventional approach for determining if an electrical discharge point is compromised is generally performed during maintenance and is typically very time consuming and costly.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A sheet that is part of a skin of an aircraft, the sheet comprising:
    an outermost surface constructed of an electrically conductive material;
    one or more electrical discharge points that are conductively coupled to the outermost surface of the sheet; and
    an electrically conductive patch disposed along the outermost surface of the sheet and conductively coupled to the outermost surface of the sheet, wherein the electrically conductive patch is constructed of a voltage responsive film configured to change from a first coloration and into a second coloration in response to experiencing a threshold voltage difference, wherein the first coloration substantially matches a coloration of the skin of the aircraft.

2. The sheet of claim 1, wherein the second coloration contrasts the first coloration of the electrically conductive patch.

3. The sheet of claim 1, wherein the sheet includes a plurality of colors, and wherein the first coloration of the electrically conductive patch matches the plurality of colors of the sheet to create a contiguous appearance between the sheet and the electrically conductive patch.

4. The sheet of claim 1, wherein the one or more electrical discharge points are configured to create a static dissipation discharge path along the outermost surface of the sheet.

5. The sheet of claim 4, wherein the electrically conductive patch is disposed along the static dissipation discharge path of the outermost surface of the sheet.

6. The sheet of claim 5, wherein the threshold voltage difference is created in response to a static charge buildup located along the static dissipation discharge path of the outermost surface of the sheet.

7. The sheet of claim 1, wherein the one or more electrical discharge points include a static wick.

8. The sheet of claim 1, wherein the one or more electrical discharge points include a bonding strap.

9. The sheet of claim 1, wherein the sheet defines an outermost perimeter, and wherein the outermost surface of the sheet includes a nuclear hardened portion disposed around the outermost perimeter.

10. The sheet of claim 9, wherein the electrically conductive patch is disposed around at least a portion of the nuclear hardened portion of the sheet.

11. The sheet of claim 1, wherein the electrically conductive patch is shaped as a symbol, one or more letters, or one or more numerals.

12. An aircraft having a skin, the aircraft comprising:
    a sheet that is part of the skin of an aircraft, wherein the sheet defines an outermost surface that is constructed of an electrically conductive material;
    one or more electrical discharge points that are conductively coupled to the outermost surface of the sheet; and
    an electrically conductive patch disposed along the outermost surface of the sheet and conductively coupled to the outermost surface of the sheet, wherein the electrically conductive patch is constructed of a voltage responsive film configured to change from a first coloration and into a second coloration in response to experiencing a threshold voltage difference, wherein the first coloration substantially matches a coloration of the skin of the aircraft.

13. The aircraft of claim 12, wherein the second coloration contrasts the first coloration of the electrically conductive patch.

14. The aircraft of claim 12, wherein the skin of the aircraft includes a plurality of colors, and wherein the first coloration of the electrically conductive patch matches the plurality of colors of the skin of the aircraft to create a contiguous appearance between the skin and the electrically conductive patch.

15. The aircraft of claim 12, wherein the one or more electrical discharge points include a static wick.

16. The aircraft of claim 12, wherein the one or more electrical discharge points are configured to create a static dissipation discharge path along the outermost surface of the sheet.

17. The aircraft of claim 16, the electrically conductive patch is disposed along the static dissipation discharge path of the outermost surface of the sheet.

18. The aircraft of claim 12, wherein the sheet defines an outermost perimeter, and wherein the outermost surface of the sheet includes a nuclear hardened portion disposed around the outermost perimeter.

19. The aircraft of claim 18, wherein the electrically conductive patch is disposed around at least a portion of the nuclear hardened portion of the sheet.

20. A method for detecting a compromised electrical discharge point along a skin of an aircraft, the method comprising:

creating a static charge buildup across an outermost surface of a sheet that is part of the skin of the aircraft, wherein the static charge buildup is created by a static charge that collects along a static dissipation discharge path along the outermost surface of the sheet;

creating a threshold voltage difference along the static dissipation discharge path by the static charge buildup; and changing an electrically conductive patch disposed along the outermost surface of the sheet from a first coloration to a second coloration in response to experiencing the threshold voltage difference, wherein the electrically conductive patch is constructed of a voltage responsive film, and wherein the first coloration is configured to substantially match a coloration of the skin of the aircraft.

* * * * *